United States Patent [19]

Arnold

[11] Patent Number: 5,023,914

[45] Date of Patent: Jun. 11, 1991

[54] ACOUSTICAL FREQUENCY RESPONSE IMPROVING WITH NONMINIMUM PHASE CIRCUITRY

[75] Inventor: Finn A. Arnold, Harvaro, Mass.

[73] Assignee: Bose Corporation, Framingham, Mass.

[21] Appl. No.: 167,303

[22] Filed: Mar. 11, 1988

[51] Int. Cl.[5] .................... H03G 5/00

[52] U.S. Cl. .................... 381/97

[58] Field of Search .................... 381/97, 98, 103

[56] References Cited

U.S. PATENT DOCUMENTS

| | | | |
|---|---|---|---|
| Re. 29,529 | 1/1978 | Heaslett | 381/103 |
| 2,816,165 | 12/1957 | Carrell | 381/97 |
| 3,755,749 | 8/1973 | Van Ryswyk | 381/103 |

FOREIGN PATENT DOCUMENTS

| | | | |
|---|---|---|---|
| 142900 | 6/1986 | Japan | 381/97 |
| 281799 | 12/1986 | Japan | 381/97 |

*Primary Examiner*—Tommy P. Chin
*Attorney, Agent, or Firm*—Fish & Richardson

[57] ABSTRACT

A sound system has at least two loudspeaker drivers and associated amplifiers and operate over frequency ranges at least part of which are in common. Non-minimum phase circuitry modifies the signal applied to at least one of the loudspeaker drivers to provide a frequency response at a desired listening position that is more uniform.

9 Claims, 2 Drawing Sheets

ACOUSTICAL FREQUENCY RESPONSE IMPROVING WITH NONMINIMUM PHASE CIRCUITRY

BACKGROUND OF THE INVENTION

The present invention relates in general to controlling the frequency response of an acoustical system and more particularly concerns novel apparatus and techniques for improving the acoustical frequency response of a system having spaced loudspeakers operating over a common frequency range. The invention is especially useful in reducing undesired peaks and dips in an automotive sound system having speakers installed in different locations.

In an automotive sound system, speakers are often installed in different locations. If the speakers radiate sound in a common bass frequency range, several problems may arise. Cancellation or reinforcement respectively of signals at the same frequency coming from two or more spaced loudspeakers may produce dips and peaks in the frequency response at the listener's location. These dips and peaks are particularly objectionable in music reproduction at the lower frequencies for which the wavelength is large compared to the diameter of the listener's head.

A typical prior art approach uses minimum-phase networks for equalization of multi-speaker systems. However, minimum-phase networks cannot sufficiently smooth the low frequency response at the listener's position because of the inherent constraint between the phase and magnitude of the frequency response of minimum-phase networks. The problem is more difficult to solve for multiple listener locations, for example, in front and rear seats of an automobile. Solving the smoothing problem then requires more degrees of freedom in design than achieving equalization for a single location.

It is an important object of this invention to provide improved acoustical response in a region energized by multiple spaced loudspeakers.

SUMMARY OF THE INVENTION

According to the invention, there are at least two spaced loudspeakers energized through a path including nonminimum-phase networks providing equalization over a common frequency range.

Numerous other features, objects and advantages of the invention will become apparent from the following description when read in connection with the accompanying drawing in which:

DETAILED DESCRIPTION

Figure 1:
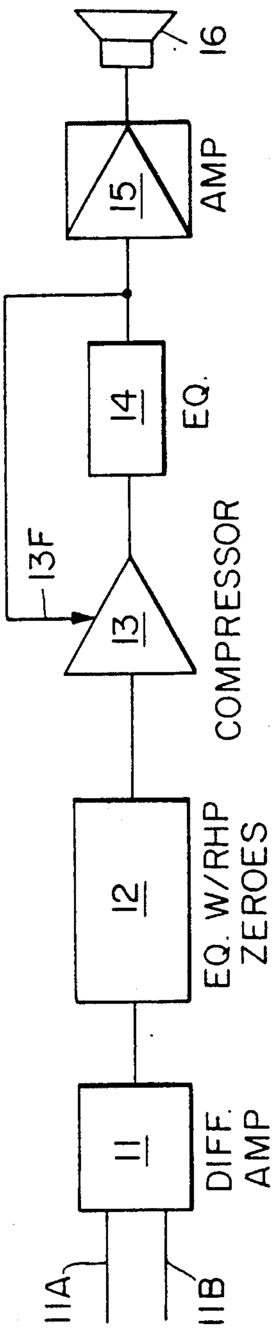
FIGS. 1 and 2 are block diagrams illustrating the logical arrangement of systems according to the invention.
Figure 2:
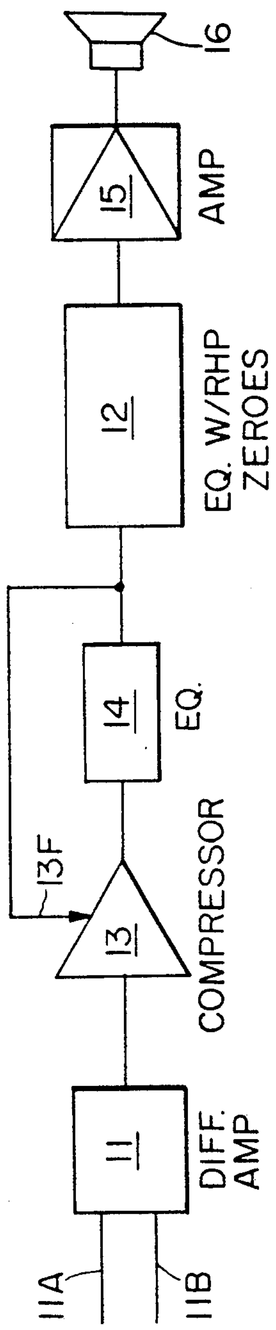

With reference now to the drawing, and more particularly FIGS. 1 and 2 thereof, there are shown block diagrams illustrating the logical arrangement of systems according to the invention. Corresponding elements are identified by the same reference symbol throughout the drawing.

A differential amplifier 11 receives left and right audio signals on input lines 11A and 11B, respectively, to provide a combined signal. In the embodiment of FIG. 1, this signal is delivered to the input of nonminimum phase circuit 12 comprising an equalizer circuit with right-half plane zeros. In the embodiment of FIG. 2, this combined signal is delivered to compressor 13. In the embodiment of FIG. 1 the output of nonminimum phase circuit 12 is delivered to the input of compressor 13. In both embodiments the output of compressor 13 is delivered to equalizing circuitry 14 whose output is fed back to feedback input 13F of compressor 13. In the embodiment of FIG. 1 the output of equalizer 14 is delivered to power amplifier 15. In the embodiment of FIG. 2 the output of equalizer 14 is delivered to nonminimum phase equalizing circuit 12 having right-half plane zeros. In this embodiment the output of nonminimum phase circuit 12 is delivered to power amplifier 15. In both embodiments the output of power amplifier 15 energizes loudspeaker driver 16.

Figure 3:
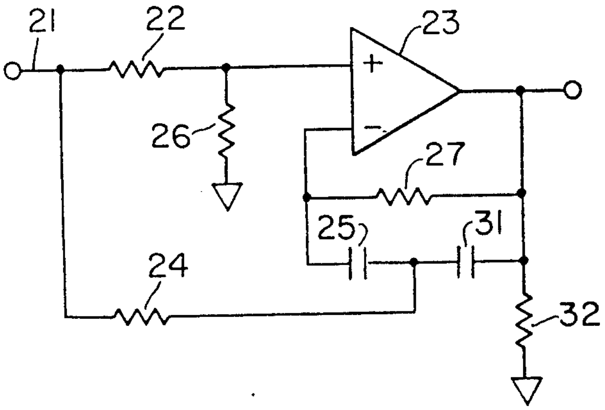
FIG. 3 is a schematic circuit diagram of an equalizer circuit according to the invention with complex right-hand plane zeros.

Referring to FIG. 3, there is shown a schematic circuit diagram of a suitable embodiment of nonminimum phase circuit 12. The input terminal 21 is connected by resistor 22 to the + input of operational amplifier 23. Resistor 24 and capacitor 25 connect input terminal 21 to the − input of operational amplifier 23. Resistor 26 is connected between the + input of operational amplifier 23 and ground. Feedback resistor 27 is connected between the output of operational amplifier 23 and the − input and shunted by capacitor 25 in series with capacitor 31. Resistor 32 is connected between the output of operational amplifier 23 and ground. This embodiment of the nonminimum phase circuitry is characterized by complex right-hand plane zeros.

Figure 4:
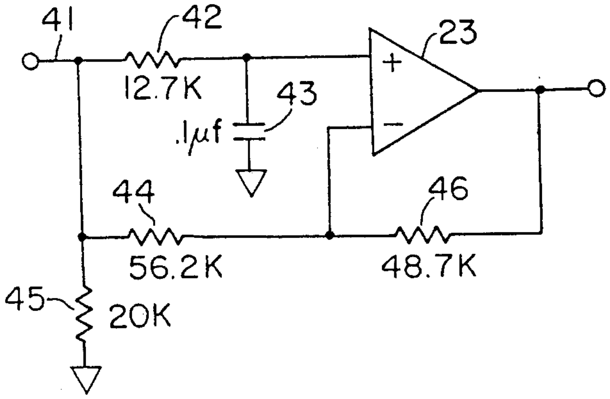
FIG. 4 is a schematic circuit diagram of an embodiment of the invention with real right-hand plane zeros.
Figure 5:
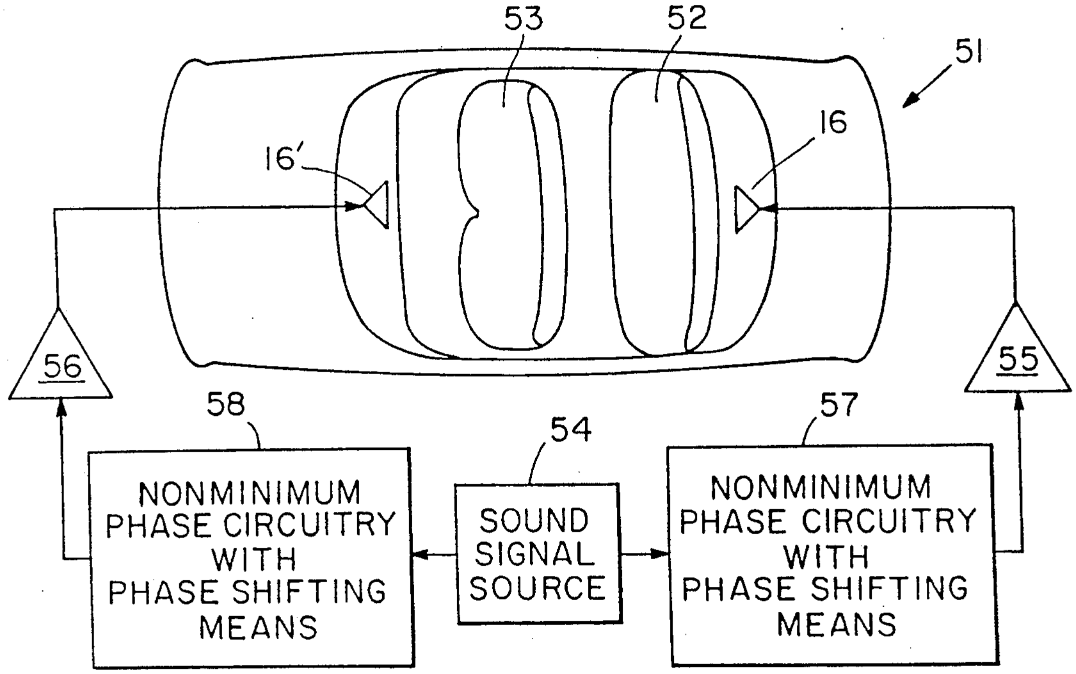
FIG. 5 is a combined pictorial-block representation of a system according to the invention in an automobile.

Referring to FIG. 4, there is shown another embodiment of this nonminimum phase circuit 12 characterized by real right-half plane zeros. Input terminal 41 is connected to the + input of operational amplifier 23 by resistor 42. Capacitor 43 is connected between the + input of operational amplifier 23 and ground. Resistor 44 connects input terminal 41 to the − input of operational amplifier 23. Resistor 45 is connected between input terminal 41 and ground. Feedback resistor 46 is connected between the output of operational amplified 23 and the − input. FIG. 3 sets forth parameter values of an actual working embodiment of the equalizer circuit with a pole at 125.3 Hz and a zero in the right-half plane on the real axis at 144.6 Hz. Referring to FIG. 5, there is shown a combined pictorial-block diagram illustrating an embodiment of the invention in an automobile 51 having a rear loudspeaker driver 16 behind rear seat 52 and a front loudspeaker driver 16' before front seat 53. Sound signal source 54 energizes loudspeaker drivers 16 and 16' through amplifiers 55 and 56, respectively and nonminimum phase circuitry with nonminimum phase network and phase shifting means 57 and 58, respectively.

The invention has a number of advantages. In addition to providing a more uniform magnitude of frequency response in one or more positions in the listening environment, the nonminimum phase networks can often significantly increase the dynamic range of a sound reproducing system for given amplifier and speakers. This advantageous result occurs because, for a given acoustical power to be delivered to any listening position from multiple speakers radiating over a common frequency band, the speakers and amplifiers are required to deliver the least power when the acoustic contributions from each speaker are in phase at the listening position. Thus, for a given maximum acoustical power output from the speakers, the acoustical power at the listening position, and therefore the dynamic range, is maximized by using nonminimum phase networks.

System efficiency may be defined as acoustical power at the listening position divided by the electrical power supplied to the amplifiers. The system efficiency is therefore also increased by the use of nonminimum phase networks for the reason set forth in the preceding paragraph.

The invention may be embodied in a system using any number of speakers greater than one operating over some common frequency range. The speakers may be woofers or full-range speakers. They may be equalized or unequalized systems. While the invention is especially advantageous in automobiles as shown in FIG. 5, it may also be advantageously practiced in other environments, including auditoria and other rooms.

A phase difference between the signals presented to the at least two speakers may be realized either with a single nonminimum phase network affecting the signal applied to one speaker as shown in FIG. 7, or with two nonminimum phase networks which have different phase shifts in the relevant frequency range as shown in FIG. 6.

A specific network may be designed by measuring the frequency response at a predetermined listening position such as on rear seat 52 or front seat 53, determining the difference between the measured response and the desired response at the listening position and designing nonminimum phase circuitry that compensates for the difference between desired and measured response in accordance with well-known network synthesis techniques. For effecting a desired response in both a front seat listening position and a rear seat listening position, it may be desirable to provide equalization which would involve reducing the response in the common frequency range in one location and increasing it in the other so that the response in both locations is substantially the same. This may be accomplished with a nonminimum phase network associated with respective ones of the listening locations.

The invention may include a number of properties. The phase shift introduced by the nonminimum phase circuitry is typically not proportional to frequency over most of the audio spectrum. The common frequency range typically includes frequencies below 1 kHz. There may be two different nonminimum phase networks which impart different phase shifts to spectral components in the region below 500 Hz. The two different nonminimum phase networks may impart substantially the same phase shift to spectral components above 1 kHz.

It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein discloses and limited solely by the spirit and scope of the appended claims.

What is claimed is:

1. A sound system comprising, at least first and second spaced loudspeaker drivers, first and second amplifiers in first and second signal paths respectively connected to said first and second loudspeaker drivers respectively, said first and second loudspeaker drivers operating over frequency ranges at least part of which are in common, and nonminimum phase circuitry in at least one of said signal paths including means for introducing phase shift for modifying the signal applied to said first loudspeaker driver relative to the signal applied to said second loudspeaker driver to provide a more uniform frequency response in the common frequency range at a listening position spaced from said first and second loudspeaker drivers.

2. A sound system in accordance with claim 1 wherein the means for introducing phase shift is characterized by a phase shift that is not proportional to frequency over most of the audio spectrum.

3. A sound system in accordance with claim 1 wherein said common frequency range includes frequencies below 1 kHz.

4. A sound system in accordance with claim 1 and further comprising, an automobile,

5. A sound system comprising, at least first and second spaced loudspeaker drivers, first and second amplifiers in first and second signal paths respectively connected to said first and second loudspeaker drivers respectively, said first and second loudspeaker drivers operating over frequency ranges at least part of which are in common, and nonminimum phase circuitry in at least one of said signal paths including means for introducing phase shift for modifying the signal applied to said first loudspeaker driver relative to the signal applied to said second loudspeaker driver to provide more uniform frequency response in the common frequency range at a listening position spaced from said first and second loudspeaker drivers, wherein said nonminimum phase circuitry is characterized by complex right-half plane zeros.

6. A sound system in accordance with claim 5 wherein the Q associated with said right-half plane zeros is greater than 1.

7. A sound system in accordance with claim 1 wherein said nonminimum phase circuitry comprises at least two different nonminimum phase networks.

8. A sound system in accordance with claim 7 wherein said two different nonminimum phase networks impart different phase shifts to spectral components in the region below 500 Hz.

9. A sound system in accordance with claim 7 wherein said two different nonminimum phase networks impart substantially the same phase shift to spectral components above 1000 Hz.

* * * * *